United States Patent [19]

Nobue et al.

[11] Patent Number: 4,727,407
[45] Date of Patent: Feb. 23, 1988

[54] IMAGE SENSOR

[75] Inventors: Mamoru Nobue; Sadahiro Tei; Shigeru Sato; Takashi Ozawa, all of Ebina, Japan

[73] Assignee: Fuji Xerox Co., Ltd., Tokyo, Japan

[21] Appl. No.: 753,568

[22] Filed: Jul. 10, 1985

[30] Foreign Application Priority Data

Jul. 13, 1984 [JP] Japan .................. 59-145662
Jul. 30, 1984 [JP] Japan .................. 59-160126
Jul. 30, 1984 [JP] Japan .................. 59-160125

[51] Int. Cl.$^4$ .................. H01L 27/14; H01L 31/00; H01L 25/04
[52] U.S. Cl. .................. 357/30; 357/2; 357/84
[58] Field of Search .................. 357/30, 2, 84

[56] References Cited

U.S. PATENT DOCUMENTS 4,527,007 7/1985 Fuse .................. 357/30
4,532,536 7/1985 Hatanaka et al. .................. 357/84

Primary Examiner—James W. Davie
Assistant Examiner—Georgia Y. Epps
Attorney, Agent, or Firm—Handal & Morofsky

[57] ABSTRACT

In a sandwich type image sensor having a photoelectric converting portion comprising a photoelectric conductive layer interposed between an upper electrode and a lower electrode, a light-shielding means is provided for selectively covering an end portion of the photoelectric conductive layer so as to be excluded from a light-receiving area of the converting portion. Alternatively, an insulating layer partly blocking the contact between the photoelectric conductive layer and the lower electrode is provided for effectively defining the light-receiving area of the converting portion. In an example where the photoelectric is divided so that it is operable as those of a plurality of sensor elements arranged in a row, a light-shielding means is provided for defining light-receiving areas of the sensor elements, while overlapping areas of the upper and lower electrodes are adjusted for equalizing the stray capacitances of the sensor elements inclusive of their connecting portions.

17 Claims, 30 Drawing Figures

IMAGE SENSOR

BACKGROUND OF THE INVENTION

1. Field of the Invention

This invention relates to an image sensor and a method for producing the same, in which the light receiving area of the sensor is restricted by a light shielding layer or the like.

2. Description of the Prior Art

A contact type image sensor having a length substantially equal to the width of the original, and utilizing an amorphous semiconductor such as amorphous silicon (a-Si), or a polycrystalline thin layer such as cadmium sulfide (Cds)—cadmium selenide (CdSe) and the like as a photoelectric conduction layer has been widely known, and the application thereof to the field of an image reading apparatus of a wide reading area is attracting attention because it requires no image-reducing optical system. A fundamental construction of an image sensor formed into a sandwich type is shown in FIG. 19 wherein a photoconductive layer 4 is interposed between a lower electrode 2 formed on a substrate 1 and an upper electrode 3 made of a transparent substance. In the contact type image sensor, a plurality of sensor elements (for instance, in a case of 8 dots/mm, 1728 elements for the fourth size of A series, and 2048 elements for the fourth size of B series of Japanese Industrial Standard) are arranged in parallel on a long substrate. In order to assure correct reading, the sensor elements must be completely independent from each other, and the light-receiving portions of the sensor elements must have equal areas with respect to each other. Especially, the equal area requirement must be strictly observed so that the areas of the light-receiving portions affect greatly on the characteristics of the sensor.

Various procedures have been worked out for equalizing the areas of the light-receiving portions. For instance, in a most basic construction of the contact type sensor, the lower electrode 2 and the photoelectric conductive layer 4 are both divided in accordance with the sensor elements as shown in FIG. 20, while the transparent upper element 3 is also divided in a principal portion thereof, so that a region wherein the photoelectric conductive layer 4 is placed between the thus divided parts of the upper electrode 3 and the lower electrode 2 is defined to be the light-receiving portion of each sensor element.

With this construction, however, the production method of the sensor is complicated because the photoelectric conductive layer and upper and lower electrodes must be produced by photolithoetching processes, respectively. Furthermore, because of the deviation of patterns and the like, the light receiving surface areas of the sensor elements tend to be varied, and, during the photolithoetching processes and the like, the end portions of the photoelectric conductive layer corresponding to the boundary portions of the masks tend to be contaminated or damaged, thereby reducing the reliability and the yield of the production of the contact type sensor.

In addition, in the case of a contact type image sensor which utilizes non-doped amorphous silicon as the photoelectric conductive layer, the isolation between adjacent bits (or adjacent sensor elements) is frequently omitted in view of a high resistance ($10^9$ Ωcm at dark time) of the amorphous silicon. In this case, the photoelectric conductive layer 4 and the upper electrode 3 are respectively formed integrally, and only the lower electrode 2 is divided into separate pieces as shown in FIG. 21. With this construction also, the light receiving areas are defined by the overlapped portions of the upper electrode and the lower electrode portions thus divided. In this case, the photolithoetching process is utilized only for the formation of the lower electrodes, and the upper electrode is selectively deposited by a sputtering method and the like utilizing a metal mask or else, thereby simplifying the production process of the contact type sensor.

In this case, however, the upper electrode must be produced by placing the metal mask in close contact with the photoelectric conductive layer mode of a clean amorphous semiconductive substance for realizing a high precision pattern. The direct contact of the metal mask with the amorphous semiconductor layer tends to cause dust deposition or surface damage of the semiconductor layer, and furthermore charged particles tend to collect during the sputtering operation on a surface portion T corresponding to the edge of the metal mask, thus causing variation in the surface composition of the photoelectric conductive layer contacting the metal mask. Such variation of the surface composition tends to cause short-circuit between the sensor elements and reduces the productivity of the same.

Even in a case where the light receiving areas of the sensor elements are made equal, there still remains another problem that the outputs of the sensor elements are differentiated by the difference in the electrostatic capacities of the sensor elements.

The constructions of a sensor portion and a connecting portion of the image sensor is shown in FIG. 22(a) and also in FIG. 22(b) which is a sectional view taken along the line a-b in FIG. 22(a). By the plurality of lower electrodes 102 arranged in a row on a substrate 101, an upper transparent electrode 103, and a photoelectric conductive layer 104 interposed between the lower and upper electrodes 102 and 103, a plurality of light receiving elements 105 are formed, each of which is indicated in FIG. 23 in the form of an equivalent circuit diagram as a parallel connection of a photodiode 105a and a capacitor 105b. In the shown contact type image sensor, the light receiving elements 105 of a required number are arranged on a long substrate in the main scanning direction of the sensor at a density (of for instance 8 elements/mm) which is required for assuring a desired resolution of the original, and the light receiving elements 105 are connected through a connecting portion 106 to a driving portion D of the contact type sensor. The driving portion D comprises a power source 107, a shift register 108 and a plurality of MOS type field effect transistors 109 (MOSFET) which perform switching operations under the control of the shift register 108 for connecting the power source 107 to the sensor elements 105 successively. When each MOSFET 109 is successively ON-OFF operated for one sequence of operation under the control of the shift register 108, a closed loop is successively formed between the power source 107 and respective sensor element 105, so that an electric charge is stored in the stray capacitance 105b of the sensor element 105 and a stray capacitance 106b of the connecting portion 106.

The electric charge is neutralized in accordance with the amount of incident light applied to the sensor element, and when the stray capacitances 105b and 106b are again charged by the ON-OFF operation of the MOSFETs under the second sequence of control operation of the shift register 108, a current corresponding to the not-neutralized electric charge stored in the capacitances 105b and 106b of each sensor element flows through an output signal line 110. The electric current flowing through the line 110 is read out as an output signal of the contact type image sensor corresponding to each bit. The above described operation is repeated for each scanning line until the original is read out completely.

The connecting portion is ordinarily provided on the substrate 101 for connecting the sensor elements to the driving portion D. In this case, it is inevitable to cause difference in length of the connections between the shift register or MOSFETs and the sensor elements depending on the positions of the sensor elements, and hence deviations between the values Cx of the stray capacitances 106b formed along the connections of the portion 106 depending on the locations of the sensor elements.

When the circuit of one of the light receiving elements shown in FIG. 23 is analyzed by use of Laplacean operator S and when it is assumed that the value of the stray capacitance 105b is Cs, the initial charge of the capacitance 105b is V(a) (V(0)=V_B), and the photoelectric current flowing through the photodiode 105a is represented by Ip, an equivalent circuit as shown in FIG. 24(a) is obtained. This circuit is further simulated by a circuit shown in FIG. 24(b) when no light is applied to the light receiving element, and also by a circuit shown in FIG. 24(c) when light is applied to the light receiving element.

Thus from FIG. 24(b), $$\frac{V_B}{S} = I_B \left( \frac{1}{SC_s} + \frac{1}{SC_x} \right) \qquad (1)$$

and from FIG. 24(c), $$\frac{V_B}{S} = I_A \left( \frac{1}{SC_x} \right) + \left( I_A - \frac{I_p}{S} \right) \frac{1}{SC_s} \qquad (2)$$

On the other hand, $$V_{out(s)} = (I_A - I_B) \frac{1}{SC_x} \qquad (3)$$

from Equation (1), $$I_B = \left( \frac{C_s C_x}{C_s + C_x} \right) V_B \qquad (4)$$

from Equation (2), $$I_A = \left( \frac{1}{C_s + C_x} \right) \left( C_s C_x V_B + \frac{C_x I_p}{S^2} \right) \qquad (5)$$

Thus from the Equations (3), (4) and (5), $$V_{out(s)} = \frac{1}{C_s + C_x} \frac{C_x I_p}{S} \left( \frac{1}{SC_x} \right)$$

$$= \frac{1}{C_s + C_x} \left( \frac{1}{S} \right) I_p$$

and $$V_{out(t)} = \frac{I_p}{C_s + C_x} t \qquad (6)$$

From Equation (6), it is apparent that the output read out by each bit of the contact type image sensor shown in FIG. 23 is varied by the capacitances 105b and 106b.

In a case where the sensor elements are formed to be equal to each other, the values Cs of the stray capacitances 105b are all held to be constant, and therefore the output from each bit of the sensor element is varied by the value Cx of the stray capacitance 106b formed along the connection line 106, and the difficulty of the output of the contact type image sensor being deviated by the capacitance 106b cannot be eliminated.

SUMMARY OF THE INVENTION

A primary object of the present invention is to provide a contact type image sensor, the operational characteristics of which are substantially constant, and the reliability of which is sufficiently high. Another object of the invention is to provide a production method for the image sensor, the execution of which is much facilitated.

These and other objects of the present invention are achieved by an image sensor and a production method therefor wherein a photoelectric converting portion is provided by interposing a photoelectric conductive layer between an upper electrode and a lower electrode in a sandwich shape, and the photoelectric converting portion is selectively covered by a light shielding layer for defining the light-receiving area of the sensor.

According to one embodiment of the present invention, a sandwich shaped photoelectric converting portion is beforehand provided to be wider than a light receiving region, and the photoelectric converting portion is thereafter coated by a light-shielding passivation film and the like provided with a light-transmitting opening thereby defining light-receiving area of the photoelectric converting portion.

In this manner, the degree of precision of a pattern required for forming the upper transparent electrode can be reduced, and since it is not required to contact a metal mask with the photoelectric conductive layer, the possibility of spoiling or damaging the surface of the photoelectric conductive layer can be substantially reduced and the yield of the production of the sensor can be substantially improved.

Furthermore, even if a portion T of the photoelectric conductive layer corresponding to a marginal portion of the transparent electrode is contaminated or damaged, the portion T is covered by the light-shielding film and hence is excluded from the light receiving region, so that the contamination and the like of the portion T entails no disadvantageous effect on the operation of the contact type sensor.

According to this embodiment, the light receiving portion is defined by the light-shielding film which is placed to cover the photoelectric converting portion selectively. Thus, the end portion of the photoelectric conductive layer which might be contaminated or damaged at the time of coating, is not utilized as a sensing portion, and since only a central portion of the layer not contaminated or damaged is utilized for sensing, the reliability and the productivity of the contact type sensor can be substantially improved.

According to another arrangement of the invention, there is provided an insulating layer between the lower electrode which is separated into a plurality of lower electrodes arranged in parallel and the photoelectric conductive layer made of an amorphous semiconductor, so that light-receiving areas of the sensor elements are thereby defined.

At the time of the production, a step of forming the insulating layer in accordance with the pattern of the lower electrodes is added to the ordinary sensor production steps between the formation of the lower electrodes and the photoelectric conductive layer, and the light-receiving areas of the sensor elements are defined by the insulating layer.

In this manner, the light-receiving areas are defined prior to the formation of the sensor, more specifically before the formation of the photoelectric conductive layer which is easily damaged, and hence an image sensor of a desired design can be produced by simple processes without lowering the reliability of the sensor particularly during the execution of the photolithoetching process.

Furthermore, since the definition of the light-receiving areas is carried out on the lower electrode side by use of a precision working process such as the photolithoetching process and the like, the operational characteristics of the sensor elements can be equalized at a high precision.

Since the defining of the light-receiving areas is effected before the formation of the photoelectric conductive layer, the production of the sensor is facilitated, and the possibility of the photo-electric conductive layer being damaged during the photolithoetching process and the like can be eliminated, thus improving the reliability of the sensor.

In case of utilizing a device having multilayer connections, the light-receiving area defining insulating layer may be formed simultaneously with the interlayer insulating layer, and hence no additional process is required.

According to still another arrangement of this invention, deviation in the capacitances of associated circuit such as the connecting portion and the like are eliminated in a manner such that the light-receiving areas of the light-receiving elements are restricted so as to maintain the operational characteristics of the elements at a constant value, while the capacitances of the light-receiving elements are regulated by varying the areas of the overlapping portions of the lower electrodes and the upper electrode as required. In this manner, the sum of the capacitances of the element and the capacitance of the connecting portion is made constant for each of the element, and the deviation between the readout outputs of the sensor elements can be eliminated.

When the overlapping areas of the upper and lower electrodes are varied, the areas of the operative portions of the light-receiving elements are varied, thus deviating the output currents of the sensor elements. According to this arrangement the light-receiving areas are restricted by the opening or slit of the light shielding film, while the overlapping areas of the upper and lower electrodes are varied separately. With this arrangement, there is no necessity of providing another correcting circuit such as a shading correction circuit and the like and the production cost of the sensor can be thereby reduced.

BRIEF DESCRIPTION OF THE DRAWINGS

In the accompanying drawings.

DESCRIPTION OF THE PREFERRED EMBODIMENTS

Figure 1:
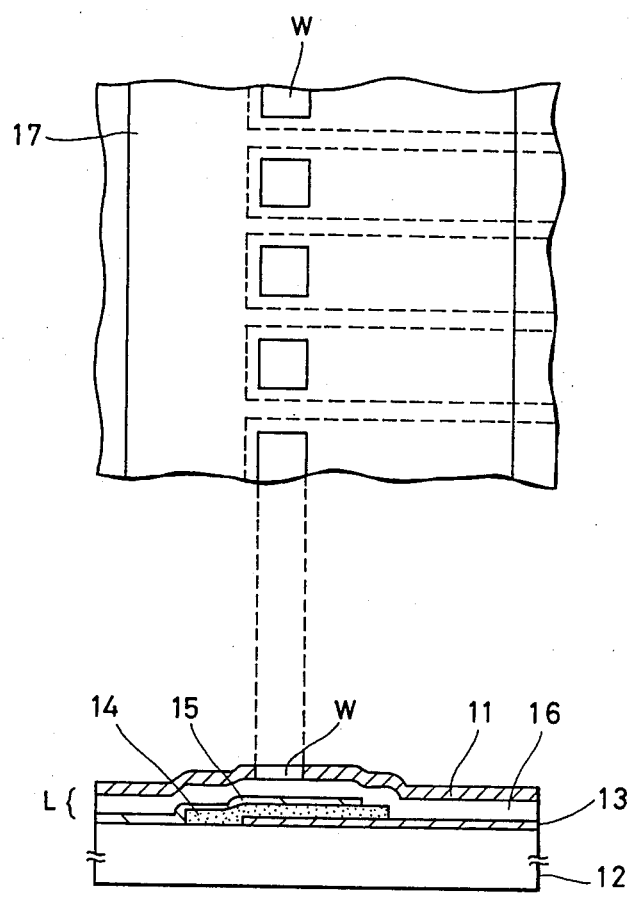
FIG. 1 is a diagram showing an image sensor constituting a preferred embodiment of the present invention.

FIG. 1 illustrates a preferred embodiment of the present invention wherein a photoelectric converting portion L of an ordinary sandwich type construction formed into a comparatively wide range is covered by a light shielding film 11 made of, for instance, an acrylic resin and having a plurality of openings W.

The photoelectric converting portion L comprises an insulating glass substrate 12, a lower electrode layer 13 made of chromium deposited on the substrate 12 and divided into a plurality of lower electrodes, a photoelectric conductive layer 14 made of amorphous silicon hydride formed on the lower electrode layer 13, and a transparent upper electrode 15 made of indium tin oxide deposited on the photoelectric conductive layer 14. The entire surface of the photoelectric converting portion L is then coated with a transparent acrylic resin film 16, and then covered by the light-shielding acrylic resin film 11 having openings W. The light-shielding acrylic resin film 11 is made by adding a light-shielding coloring matter into the acrylic resin similar to that used for providing the acrylic resin film 16.

The method for producing the image sensor will now be described.

Figure 2:
FIGS. 2 through 5 are cross-sectional view showing production steps of the embodiment shown in FIG. 1.
Figure 3:
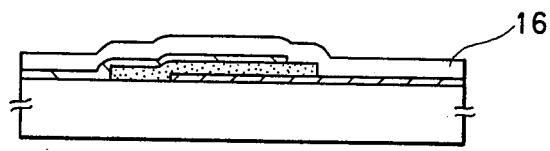
Figure 4:
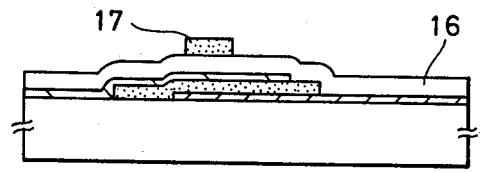
Figure 5:
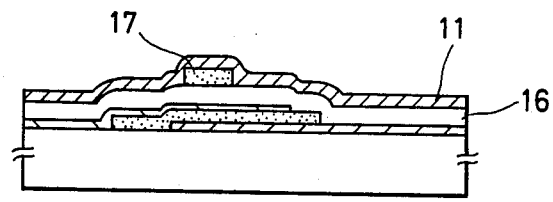

Firstly the photoelectric converting portion L of the sandwich type and having a wider area than a required light receiving area is formed according to an ordinary method on the insulating glass substrate 12 as shown in FIG. 2. Then, the entire surface of the substrate is coated by the transparent acrylic resin film 16 as shown in FIG. 3. Then a photoresist is applied over the acrylic resin film 16, and a resist pattern 17 is formed as shown in FIG. 4 by a photolithoetching method at positions where the openings W a re to be formed. Then the light-shielding acrylic resin 11 is applied as shown in FIG. 5 by a spin-coating method, and the resist pattern 17 is thereafter removed, thus providing the photoelectric converting portion of this invention shown in FIG. 1.

In the photoelectric converting portion thus provided, the light-receiving area for each conversion element is defined by the opening W provided in the light shielding acrylic resin film. Thus the end portion T of each conversion element is light-shielded by the light shielding resin film to be made inoperative as a sensor. As a consequence, only a region having been not damaged during the production process and held in a satisfactory condition is used as the light receiving portion of the element, thus assuring high reliability and improving the productivity.

Although a spin-coating method has been utilized in the above described embodiment for providing the light-shielding acrylic resin film, it is apparent that either one of a roll-coating method, dipping method, screen printing method and the like may likewise be used for providing the light shielding film.

Figure 6:
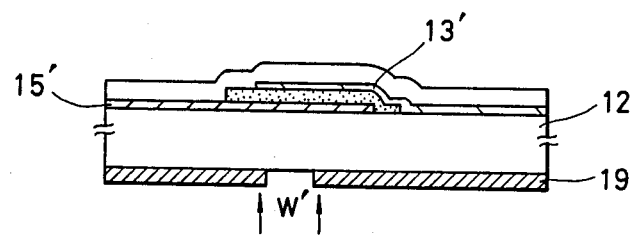
FIG. 6 is a cross-sectional view showing a modification of the embodiment shown in FIG. 1.

Furthermore, in the above described embodiment, light has been introduced from the upper side of the photoelectric converting portion, namely from a side opposite to the substrate. However, if the embodiment is modified as shown in FIG. 6 so that the positions of the transparent electrode 15 and the lower electrode 13 shown in FIG. 1 are interchanged between each other, forming a transparent electrode 15' made of indium tin oxide on the glass substrate 12 while forming a metal electrode 13' made of chromium on the photoelectric conductive layer, and a light-shielding package 19 having openings W' is set on the rear side of the substrate 12, the light may be introduced from the substrate side of the photoelectric portion.

The light-shielding film may otherwise be made of another organic material such as silicon resin or an inorganic material. the opening W' may further be coated by a transparent resin film. Furthermore, the transparent resin film may be impregnated with a coloring matter so that the film is utilized as a color filter.

A second embodiment of the invention wherein the connecting portion of the first embodiment is arranged in a matrix form will now be described with reference to FIGS. 7 and 8.

The image sensor constituting the second embodiment is assumed to be of the fourth size of A series with 8 dots/mm, including 1728 photoelectric conversion elements provided on a long substrate. As shown in FIG. 8 in a cross-sectional view taken along the A—A line, the sensing portion S of the sensor comprises lower electrodes 22 made of a chromium layer formed on a glass substrate 21 in a separated pattern, each electrode 22 having an electrode portion 22a and a lead-out portion 22b, an insulating layer 23 made of silicon oxide (Si Ox) which is formed to cover the lead-out portions 22b except the electrode portions 22a of the lower electrodes 22, a photoelectric conductive layer 24 made of amorphous silicon hydride ($\alpha$-Si: H) integrally formed on the insulating layer 23, a transparent upper electrode 25 made of indium tin oxide (ITO) integrally formed on the photoelectric conductive layer 24 so as to overlie the lower electrodes 22, and a surface protecting layer 26 made of a polyimide resin formed to cover the entire surface of the sensing portion provided on the substrate.

On the other hand, the driving portion D of the sensor comprises a first group of connecting layers 27 made of chromium, which are arranged horizontally in a stripe form to extend vertically to be connected with the leadout portions 22b of the lower electrodes 22, and a second group of connecting layers 28 also made of chromium, which are separated by the insulating layer 23 from the first group of layers and are arranged vertically in a stripe form. Each of the first group of connecting layers 27 is electrically connected with the corresponding one of the second group of connecting layers through a through hole 29 formed at an intersecting position of the two groups of layers. The second group of connecting layers 28 are then connected with an electric power source circuit (not shown).

With the above described construction of the sensor, the leadout portions 22b are coated by the insulating layer 23 so that only the electrode portions 22a of the lower electrodes 22 are brought into contact with the photoelectric conductive layer 24. Thus the light sensing area of the sensor elements are defined only by the electrode portions 22a of the lower electrodes 22 and the configuration of the insulating layer 23, and therefore the precision of the areas can be improved. As a consequence, there is no possibility of the components of the sensor elements being damaged by the photolithoetching process and the like, and hence the deviation in the operational characteristics of the sensor elements can be substantially eliminated.

Furthermore, since the light sensing area are defined only by the lower electrodes and the insulating layer laminated on the lower electrodes, the photoelectric conductive layer and the upper electrode have nothing to do with the defining of the light sensing area of the sensor elements as it was the case of the conventional sensor. Accordingly, the photoelectric conductive layer and the upper electrode may be patterned to those sizes sufficient to cover the light sensing area defined by the lower electrodes and else, thus simplifying the patterning processes. Since the portions such as the marginal portions of the patterns where deviations tends to occur in the thickness of the films and the like are not utilized as the operating portions of the sensor, the operational characteristics of the sensor are stabilized, and the production of a contact type image sensor which is accurate and high resolution in reading out images is thereby made possible.

The matrix driving type image sensor of the above described construction can be produced as follows.

Figure 9:
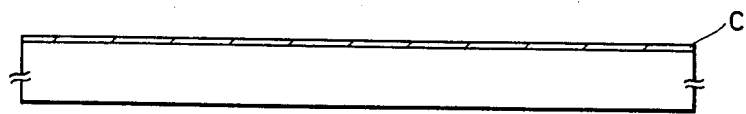
FIGS. 9 through 13 are cross-sectional views showing production steps of the second embodiment shown in FIG. 7.

Firstly, a thin layer C of chromium is formed, as shown in FIG. 9, on an insulating glass substrate 21 by a vacuum deposition method.

Figure 10:
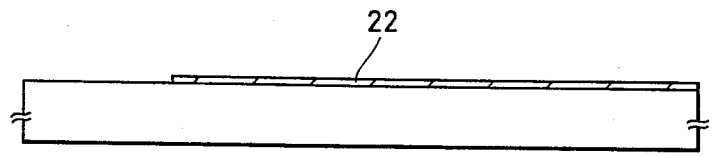

Then, by a photolithoetching method, useless parts of the chromium thin layer C are selectively removed as shown in FIG. 10, and pattern formation of the lower electrode portions 22a, leadout portion 22b and the first group of connecting layers 27 arranged in a stripe shape is carried out.

Figure 11:
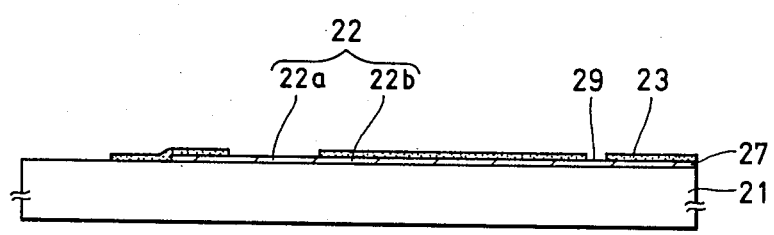

Then a silicon oxide film of approximately 2 mm thickness is formed on the chromium thin layer C by use of a CVD method, and a patterning operation is carried out by use of a photolithoetching method so as to maintain the leadout portions 22b of the lower electrodes 22 in covered state, to expose the electrode portions 22a of the lower electrodes 22 to outside, and to bore the through holes 29 in the driving portion D while leaving the remaining portions of the driving portion D to be unchanged as shown in FIG. 11. During the above described operation, the reason why the thickness of the silicon oxide film is maintained at approximately 2 mm resides in the fact that the mask registering operation is facilitated by the visualization of the lower electrode pattern. However, visualizing of the lower electrodes is not always necessary in practical cases, and hence the thickness of the silicon oxide film may be determined arbitrarily in consideration of the pattern precision and the required insulation.

Figure 12:
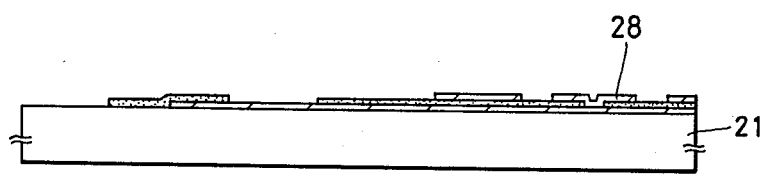
Figure 13:
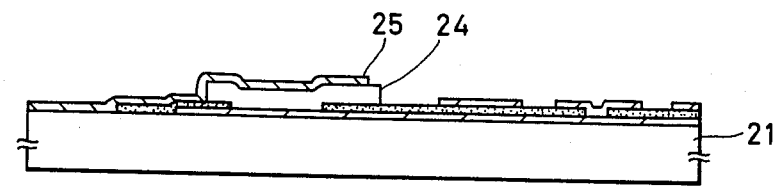

Then a thin layer of chromium is deposited and patterned by photolithoetching method into a stripe shape as shown in FIG. 12, thus providing the second group of connecting layers 28.

Figure 19:
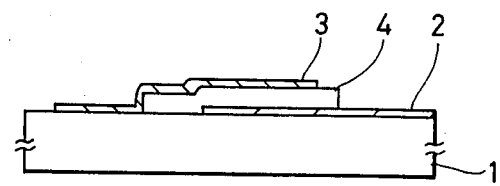
FIG. 19 is a cross-sectional view showing a basic construction of a conventional sandwich type image sensor.
Figure 20:
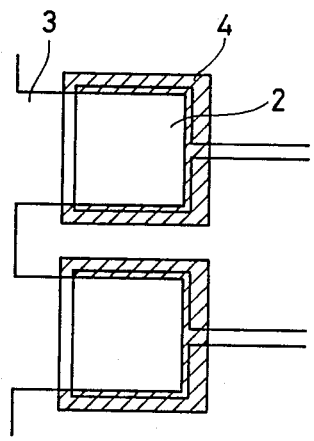
FIGS. 20 and 21 are plan views showing different constructions of the conventional image sensor.
Figure 21:
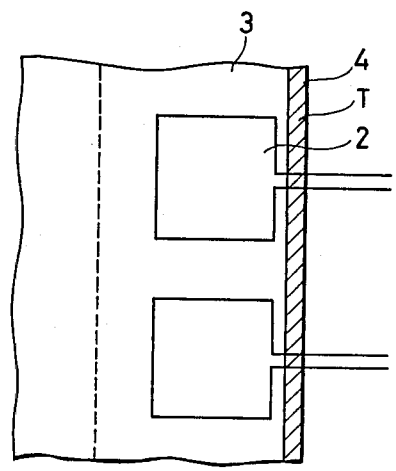
Figure 22A:
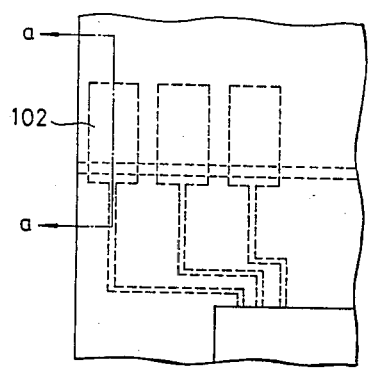
FIGS. 22(a) and 22(b) are diagrams showing the connection of the sensor elements and the driving portion of the conventional image sensor.
Figure 22B:
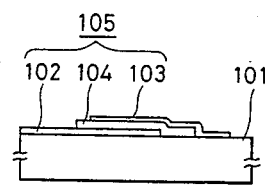
Figure 23:
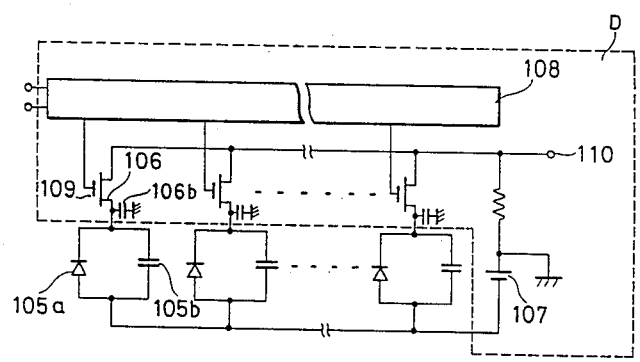
FIG. 23 is an equivalent circuit diagram of the image sensor.
Figure 24A:
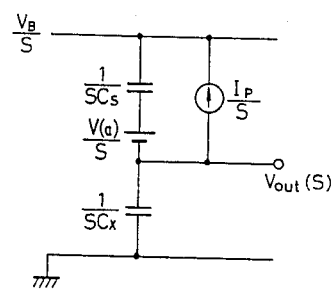
FIGS. 24(a) through 24(c) are equivalent circuit diagrams used for analizing the circuit shown in FIG. 23.
Figure 24B:
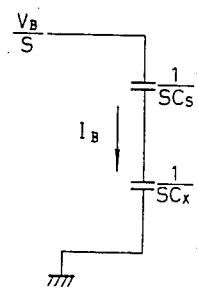
Figure 24C:
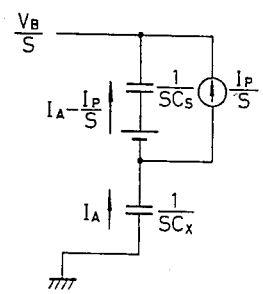

Then by a glow discharge method, non-doped amorphous silicon hydride layer operable as the photoelectric conductive layer 24 is deposited on the chromium thin layer so as to cover the electrode portions 22a of the lower electrodes 22 sufficiently, and then an indium tin oxide layer operable as the transparent upper electrode 23 is formed on the amorphous layer by a spattering method, so that a sandwich type sensor operable as a photoelectric conversion device as shown in FIG. 19 is obtained after the formation of a oxide layer. Herein, the light sensing area of the sensor elements thus formed are defined by the lower electrodes and the insulating layer formed on the lower electrodes as described before, and therefore the patterning of the amorphous silicon hydride layer and the indium tin oxide layer may be carried out such that these layers are permitted to cover a region sufficiently wider than the entire light sensing area of the sensor without requiring precision patterning of these layers. As a consequence, these layers are deposited selectively by use of metal masks having windows corresponding to belt-like resins to be deposited.

Figure 7:
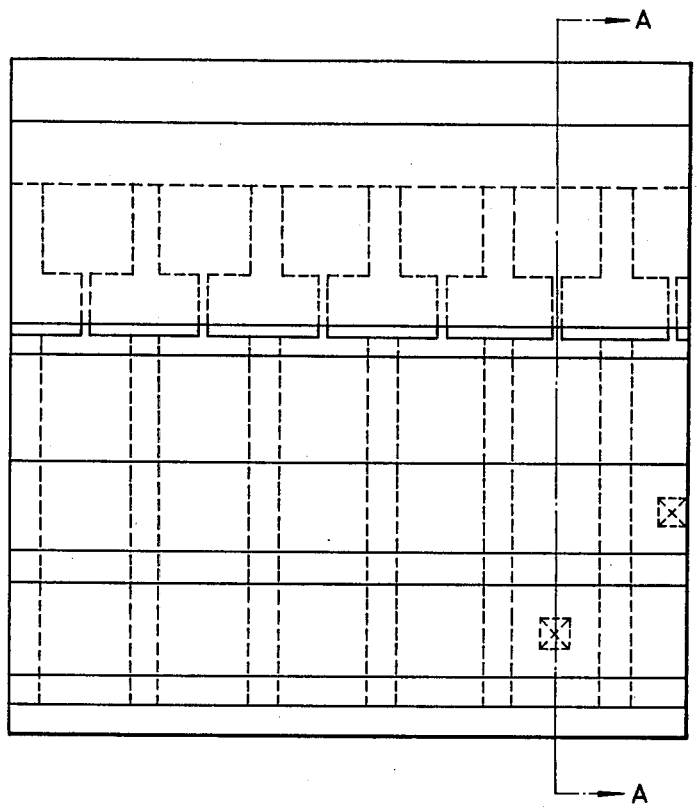
FIG. 7 is a plan view showing an important part of a matrix-drive type image sensor constituting a second embodiment of the invention.
Figure 8:
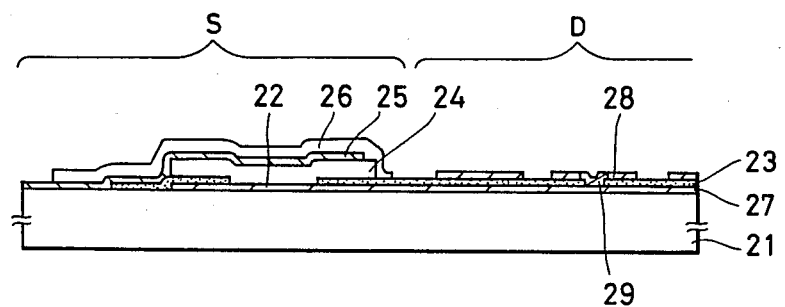
FIG. 8 is a cross-sectional view taken along the line A—A in FIG. 7.

Lastly, the sensor portion of the product is coated by a surface protecting film 26 made of a polyimide resin as shown in FIG. 7, thereby completing the production of the matrix driving type image sensor.

According to the above described production method, the light sensing area of the sensor elements can be defined at a high precision without effecting a photolithoetching process of the photoelectric conductive layer, and hence the deterioration caused by the contamination of the end portion of the photoelectric conductive layer can be avoided satisfactorily, and the production of an image sensor having a highly reliable operational characteristics is thereby assured.

Furthermore, the patterning of the insulating layer in the sensor portion may be carried out simultaneously with that of the interlayer insulating film of the driving portion, thus simplifying the production steps.

With the matrix type connection, the lengths of the connecting portions tend to increase in accordance with the length of the image sensor, rendering the stray capacitances of the connecting portions to be not negligible. Thus it has been an ordinary practice to equalize the stray capacitances by adjusting the widths and intervals of the connecting portions, and in this case, the insulating media such as the substrate, atmospheric air and the like must be considered. The variation in humidity of the atmospheric air varies the insulation in a considerable extent and affects the surface resistance of the substrate so as to vary in operation characteristics of the image sensor. In the above described embodiment, the insulating layer is provided to cover the entire surface of the substrate except the through holes, and therefore the reliability of the sensor is substantially improved.

Although a silicon oxide film has been used in the above described embodiment, any of other inorganic substances such as silicon nitride (SiNx) and the like, organic substances such as polyimide series resins or the like may otherwise be used for producing the insulating layer.

Although a matrix driving type image sensor has been described, it is apparent that the embodiment is not necessarily restricted to such a construction, and by the use of a multilayer connection technique as in the case of a contact type image sensor driven by thin-layer transistors and having a matrix type connecting portion, the driving portion of the image sensor can be constructed advantageously. In this case, the insulating layer for defining the light receiving areas can be formed simultaneously with the formation of the interlayer insulating film without requiring any additional step.

Furthermore, the insulating layer for defining the light sensing area is not necessarily formed integrally with the interlayer insulating film of the driving portion, but can be formed separately or by a separate step.

A third embodiment of the present invention will now be described with reference to FIGS. 14 through 16.

Figure 14:
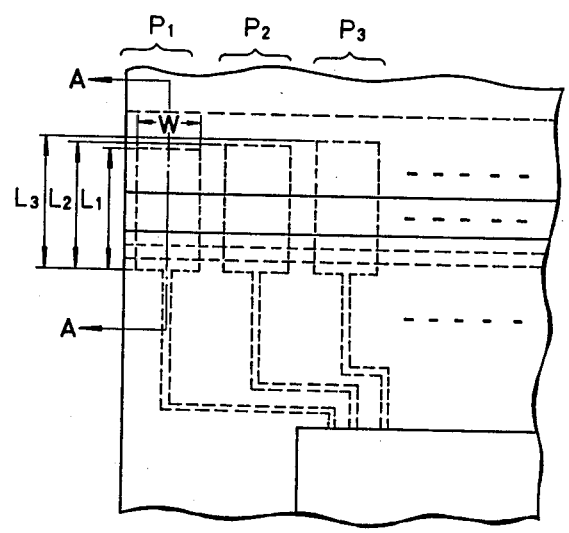
FIG. 14 is a plan view showing one part of an image sensor constituting a third embodiment of the invention.
Figure 15:
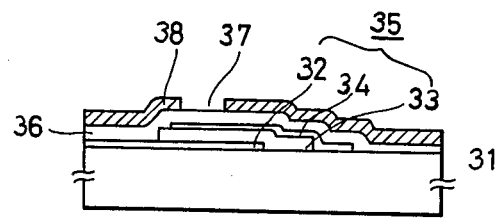
FIG. 15 is a cross-sectional view taken along the line A—A in FIG. 14.
Figure 16:
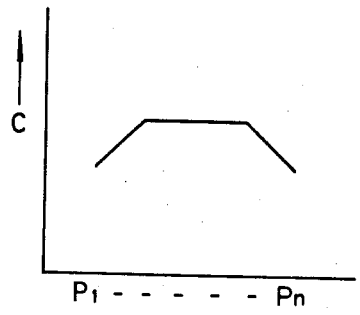
FIG. 16(a) is a diagram showing a distribution of capacitances of the sensor elements $P_1$-$P_n$ of the third embodiment of the invention.
FIG. 16(b) is a diagram showing a distribution of capacitances of connecting portions of the third embodiment.
FIG. 16(c) is a diagram showing a distribution of output currents flowing through the third embodiment.
FIG. 16(d) is a diagram showing a distribution of output currents flowing through a conventional image sensor.
Figure 16:
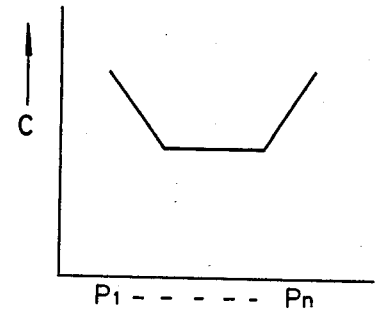
Figure 16:
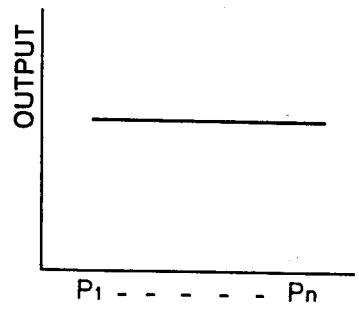
Figure 16:
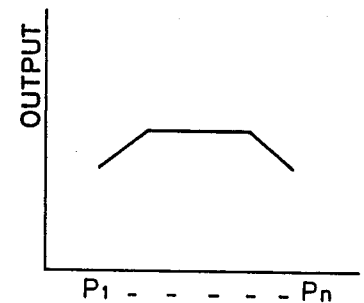

As shown in FIGS. 14 and 15, a contact type image sensor of this embodiment comprises a number n of light-receiving elements $P_1$-$P_n$ arranged in a row on an insulating glass substrate. These light-receiving elements are connected to a driving portion through a connecting portion also formed on the glass substrate.

Each of the light-receiving elements $P_1$-$P_n$ has a photoelectric converting portion 35 which comprises a lower electrode 32 formed out of a chromium layer deposited on the glass substrate 31 and patterned separately into a desired configuration, a commonly provided photoelectric coductive layer 33 made of amorphous silicon hydride which is laminated on the chromium layer, and a transparent upper electrode 34 made of indium tin oxide. The photoelectric converting portion 35 is further coated by a transparent protecting film 36 and then by a light shielding film 38 having an opening 37. The lower electrode 32 in each element has a length specifically determined for that element although the width W thereof is held constant for all elements for adjusting the area of a portion where the upper electrode 34 overlaps the lower electrode 32. As partly illustrated in FIG. 14, the lengths $L_1$, $L_2$, $L_3$ . . .

$L_n$ of the lower electrodes $P_1$, $P_2$, $P_3$, $-P_n$ for the first, second, third to n-th elements are selected such that the lengths for a central group of the lower electrodes are held constant while the lengths of the electrodes at both ends are reduced successively from the length of the central group so that the following relation holds.

$$L_1 < L_2 < L_3 - L_{n-2} > L_{n-1} > L_n \quad (1)$$

Thus the areas $G_1-G_n$ of the overlapped portions of the lower electrodes 32 and the upper electrodes 34 satisfy the following relation.

$$G_1 < G_2 < G_3 - G_{n-2} > G_{n-1} > G_n \quad (2)$$

As a consequence, the electrostatic capacitances $C_{11}-C_{1n}$ of the elements vary as shown in FIG. 16(a) being held constant for the central group while reduced successively toward the end elements $P_1$ and $P_n$.

On the other hand, the opening 37 provided through the light shielding film 38 has a constant width and extends to cover the entire elements $P_1-P_n$, thus maintaining the light receiving areas (areas operable as photoelectric converting portions) of the elements at a constant value.

Differing from the above description, the electrostatic capacitances $C_{21}-C_{2n}$ of the connecting portion vary as shown in FIG. 16(b). Accordingly capacitances of the light-receiving elements $P_1-P_n$, each of which is represented by the sum of the capacitances ($C_{11}-C_{1n}$) of the light-receiving element and the capacitances ($C_{21}-C_{2n}$) of the connecting portion, are made substantially equal to each other, and therefore the output characteristics if the elements are made even as shown in FIG. 16(c).

According to the above described arrangement of this invention, a contact type image sensor free from output deviation and capable of read out correctly can be realized, and since no shading correction circuit and the like is required, the production cost of the sensor can be economized. The light-shielding film may serve to provide mechanical protection of the light-receiving elements.

FIG. 16(d) indicates the output characteristics of a conventional construction wherein the areas of the overlapping portions of the lower electrodes and the upper electrode are made equal to each other. By comparing FIG. 16(d) with FIG. 16(c), it is apparent that the output deviation of the readout sensor can be reduced substantially.

The production method of this embodiment will now be described.

At the time of designing patterns, the lengths L and the width W of the lower electrodes, the distance between the elements, the widths of the photoelectric conductive layer and the upper transparent electrode, and the width of the opening of the light-shielding film and the like are firstly determined approximately, and the pattern of the connecting portion that connects the light-receiving elements to the driving portion is determined according to the determined values.

Then the electrostatic capacitances $C_{21}-C_{2n}$ of the connecting portion are calculated for every elements $P_1-P_n$ based on the data such as the lengths and the distances of the connecting wires and the like and the dielectric constant of the substrate. The required areas of the overlapped portions $G_1-G_n$ are then determined such that the electrostatic capacitance $C_{1m}$ of each element is made equal to the value obtained by substract-ing the capacitance $C_{2m}$ of the connecting wire and the like from an ideal value of the sum C, that is, $$C_{1m} = C - C_{2m}$$

where m is a positive integer less than n. The exact values of the lengths $L_1-L_n$ of the lower electrodes are determined from the areas of the overlapped portions $G_1-G_n$ thus determined.

After completion of the pattern design, the light-receiving elements are formed on the insulating glass substrate 31 according to an ordinary practice. In this case, only a process of forming the light-shielding film is added, and the pattern of the photomask used in the photolithoetching process of the lower electrodes is changed so as to obtain the desired configuration. Other process steps are remained unchanged from those of the conventional method, and hence the production of this embodiment can be realized in a simple manner.

Figure 17:
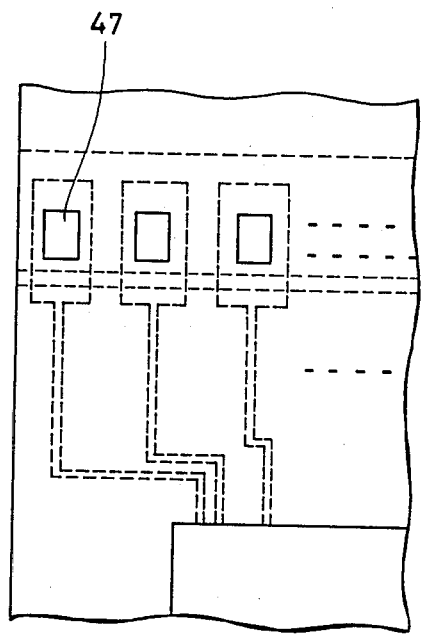
FIG. 17 is a plan view showing a further embodiment of the invention.

In an above described embodiment, the width W of the lower electrodes has been held constant at the time of varying the areas of the overlapping portions of the lower electrodes and the upper electrode, and only the length L of the lower electrodes have been varied. However, it is apparent that, instead of a single opening is formed through the light-shielding film as described above, a plurality of openings or windows 47 may be provided in correspondence to the light-receiving elements as shown in FIG. 17, and the widths of the lower electrodes may be made variable or else.

Figure 18:
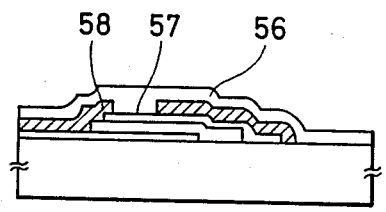
FIG. 18 is a cross-sectional view showing a still further embodiment of the invention.

Furthermore, although the light-shielding film 38 has been formed in the above described embodiment on the protective film 36, a light-shielding film 58 having an opening 57 may be provided directly on a photoelectric converting portion as shown in FIG. 18, and a transparent protective film 56 may be provided on the light-shielding film 58.

What is claimed is:

1. In an image sensor having a photoelectric converting portion of the sandwich type with a photoelectric conductive layer interposed between an upper electrode and a lower electrode, the improvement comprising light shielding means which is positioned over a portion of said upper electrode and covers a selected portion of a light sensing surface of said photoelectric converting portion for defining a light-receiving window area on said portion, an end portion of said photoelectric conductive layer being excluded from said light-receiving area.

2. An image sensor according to claim 1 wherein said photoelectric conductive layer is an amorphous semiconductor layer.

3. An image sensor according to claim 1 wherein said light-shielding means is a light-shielding film having a light-transmitting window, said light shielding being formed on a passivation film covering said photoelectric converting portion.

4. An image sensor according to claim 3 wherein said light-shielding film is an acrylic resin layer.

5. An image sensor according to claim 3 wherein said light-transmitting window is constructed by a color filter impregnated with a coloring agent, so that the window exhibits a selective light-transmitting property with respect to wave length of light incident thereinto.

6. An image sensor according to claim 1 wherein said light shielding means is a light-shielding package having a light-transmitting window.

7. An image sensor according to claim 2 wherein said light-shielding means is a light-shielding film having a light-transmitting window, said light shielding being formed on a passivation film covering said photoelectric converting portion.

8. An image sensor according to claim 2 wherein said light-shielding means is a light-shielding package having a light-transmitting window.

9. An image sensor as in claim 1, wherein the image sensor comprises a plurality of substantially identical photoelectric converting portions forming a plurality of elements.

10. An image sensor of a sandwich type having an amorphous semiconductor layer operable as a photoelectric conductive layer interposed between a lower electrode formed on a substrate and an upper electrode, wherein an insulating layer is provided at a selected area between said lower electrode and said amorphous semiconductor layer to partially block contact between said lower electrode and said amorphous semiconductor layer and said insulating layer defines a window which allows a portion of said amorphous layer to act as a light-receiving area of the image sensor.

11. An image sensor according to claim 10 wherein said insulating layer is formed to cover at least a leadout wire portion of said lower electrode.

12. An image sensor according to claim 10 wherein said insulating layer is a silicon oxide layer.

13. An image sensor as in claim 10, wherein the image sensor comprises a plurality of light-receiving areas forming a plurality of individual image sensors, said insulating layer being disposed over at least a portion of the perimeter of the area defined by the photoelectric conductive layer and the lower electrodes.

14. An image sensor having a plurality of photoelectric converting elements each defined by upper and lower electrodes and having a light receiving area, said photoelectric converting elements being arranged beside each other on a substrate, the light-receiving area of each photoelectric converting element being positioned in an opening, defined by lightshielding means formed over said upper electrodes, said window overlying an overlapping area between said lower electrode and said upper electrode of each photoelectric converting element and having an area for each photoelectric converting element which results in an electrostatic capacitance for the photoelectric converting element which compensates for deviation in electrostatic capacitance of its respective associated circuit such as a connecting portion or the like by an electrostatic capacitance of the photoelectric converting element, said electrostatic capacitance for the photoelectric converting element being determined by the overlapping area between said lower and upper electrodes.

15. An image sensor according to claim 14 wherein said light-shielding means is a light-shielding film which covers said photoelectric converting elements.

16. An image sensor according to claim 15 wherein said light-transmitting window is formed in a belt-like manner extending along a row of said photoelectric converting elements, and said overlapping area is determined to a specific value by adjusting the length of said lower electrodes.

17. An image sensor according to claim 15 wherein said light-transmitting window is formed for each photoelectric converting element separately, and said overlapping area is determined by adjusting the width of said lower electrodes.

* * * * *